United States Patent [19]

Kong et al.

[11] Patent Number: 4,884,165

[45] Date of Patent: Nov. 28, 1989

[54] DIFFERENTIAL LINE DRIVER WITH SHORT CIRCUIT PROTECTION

[75] Inventors: Samuel K. Kong, Union City; William Y. Jiang, Sunnyvale; Wallace C. W. Chan, Cupertino, all of Calif.

[73] Assignee: Advanced Micro Devices, Inc., Sunnyvale, Calif.

[21] Appl. No.: 274,319

[22] Filed: Nov. 18, 1988

[51] Int. Cl.$^4$ ............................................. H02H 3/00
[52] U.S. Cl. ..................................... 361/98; 361/101; 307/296.4; 307/296.5; 370/207 P
[58] Field of Search .................... 361/92, 87, 100, 101, 361/98; 370/207 P, 298; 307/296.4, 296.5

[56] References Cited

U.S. PATENT DOCUMENTS 3,845,405 10/1974 Leidich ............................ 361/98 R
4,404,478 9/1983 Fox ...................................... 361/93

Primary Examiner—Derek S. Jennings
Attorney, Agent, or Firm—Flehr, Hohbach, Test, Albritton & Herbert

[57] ABSTRACT

A short-circuit protected line driver circuit is particularly adapted for use in a differential line driver system, where one line driver circuit provides a true output signal and another line driver circuit provides a complementary false output signal. A short-circuit is sensed by measuring current through a secondary pull-up transistor and disabling a primary pull-up transistor if a short-circuit fault occurs which exceeds a predetermined current level for a predetermined time.

20 Claims, 6 Drawing Sheets

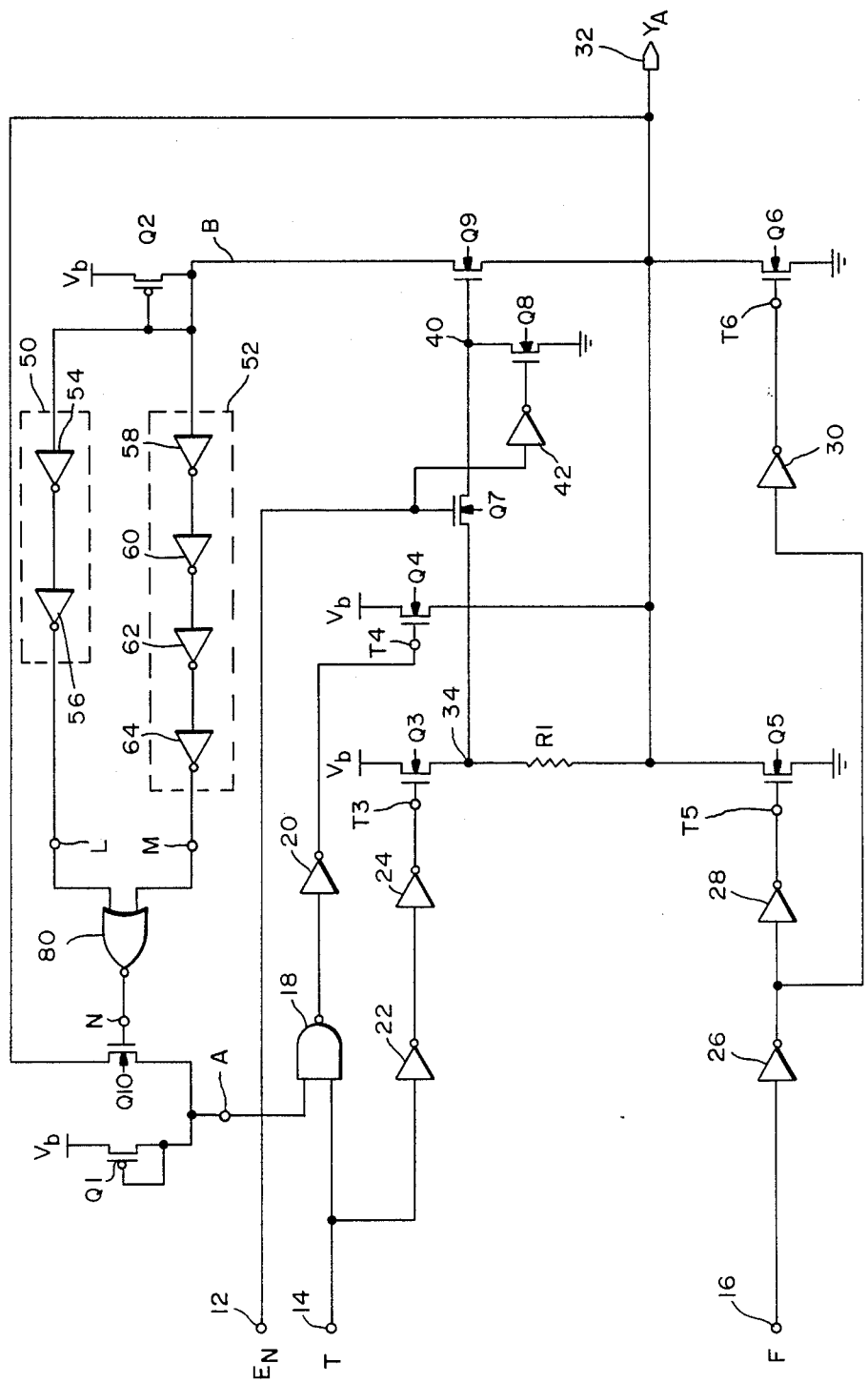
FIG.—1

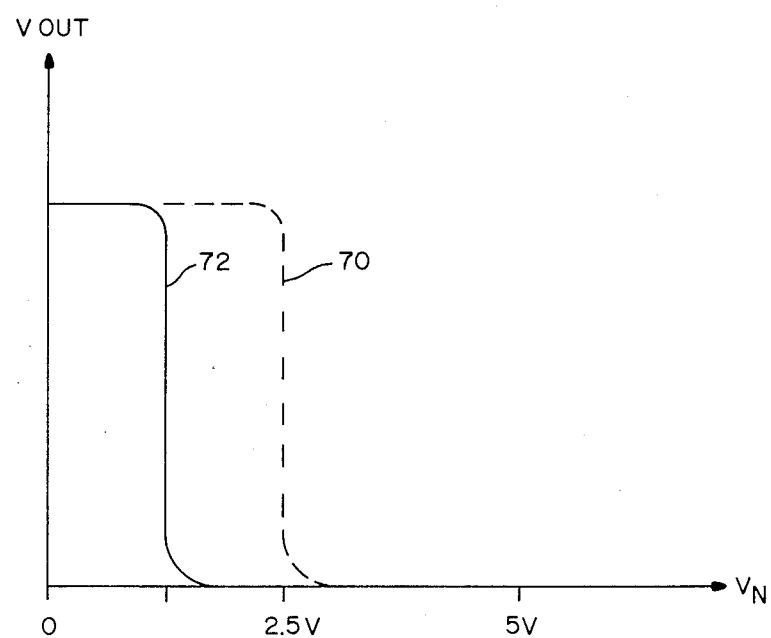
FIG.—2

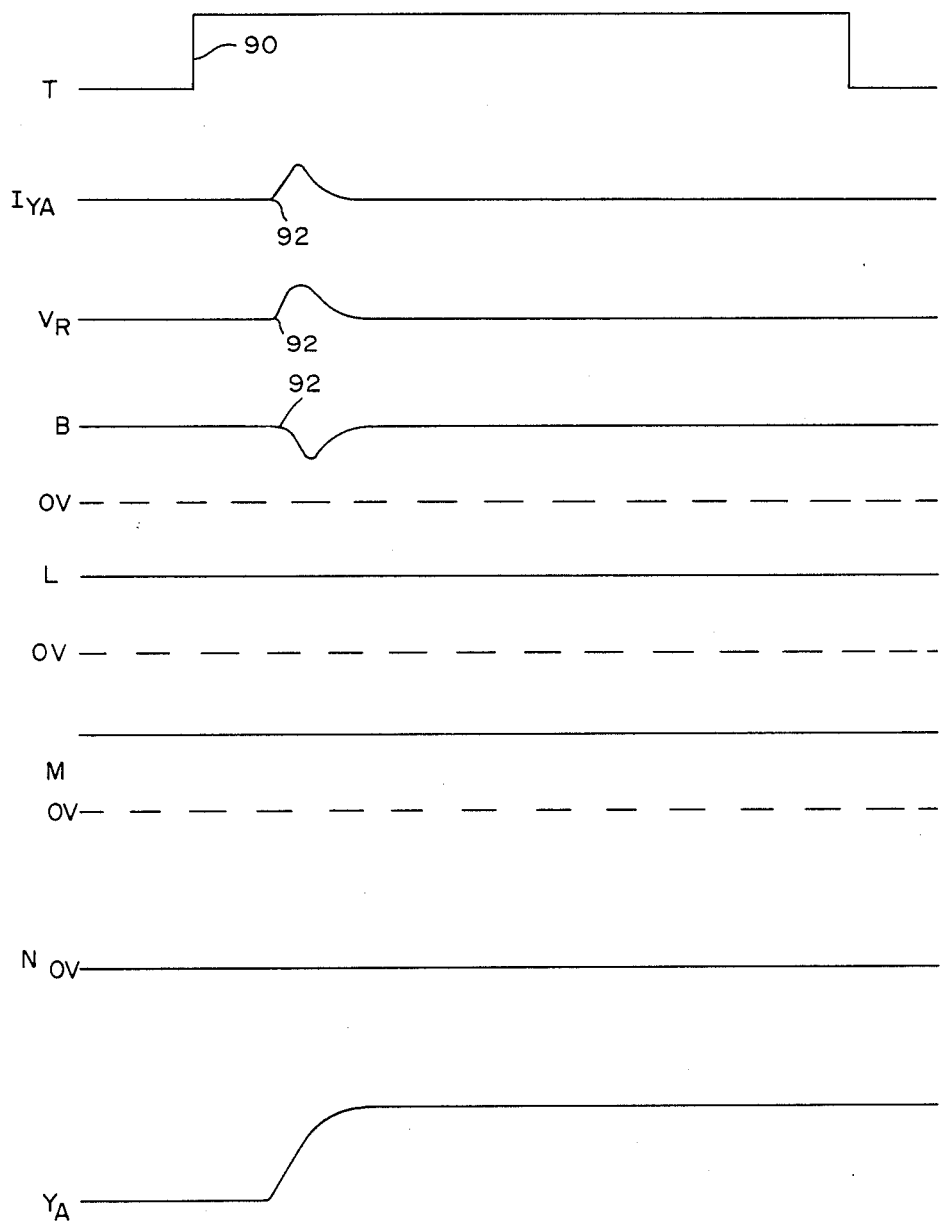
FIG.—3

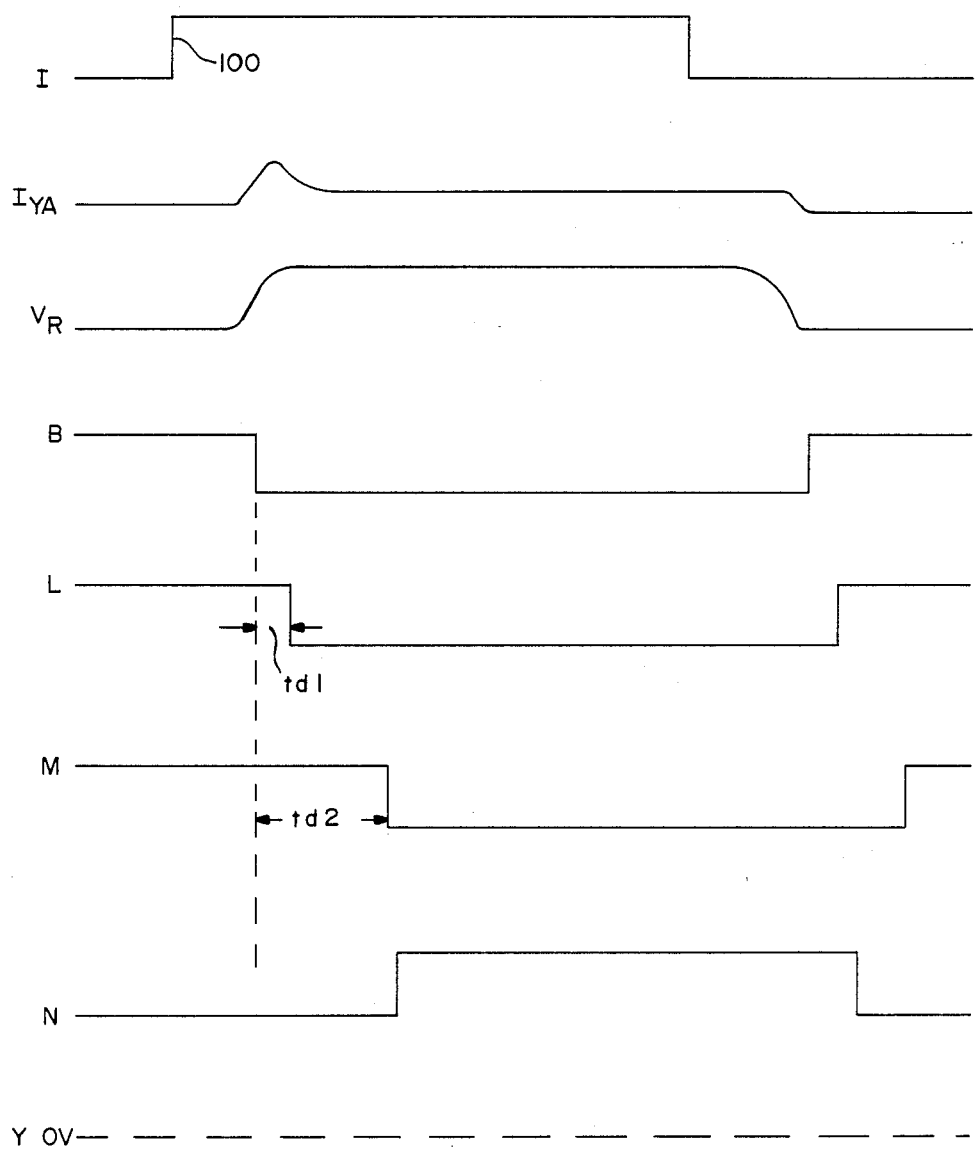
FIG.—4

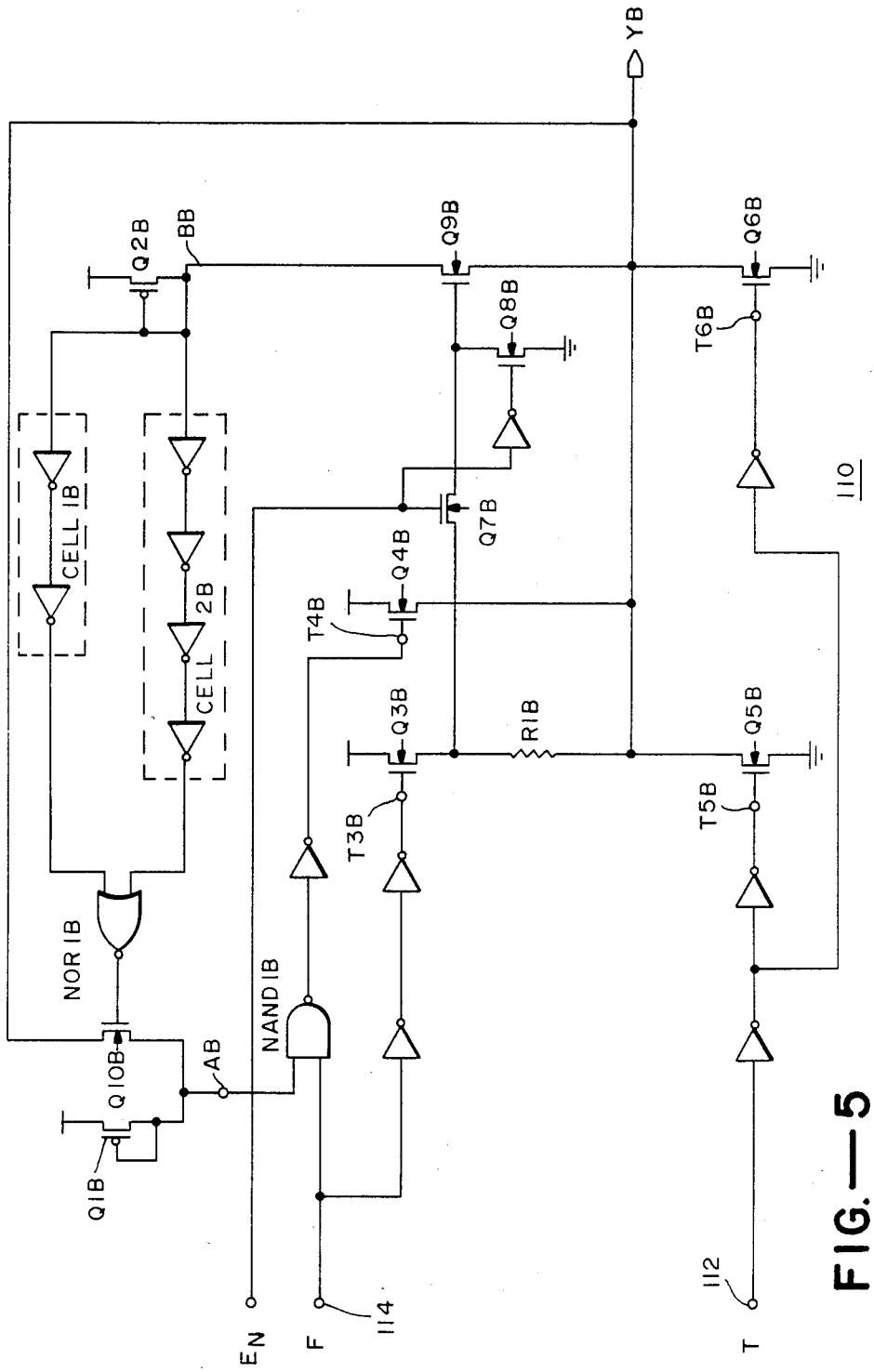
FIG.—5

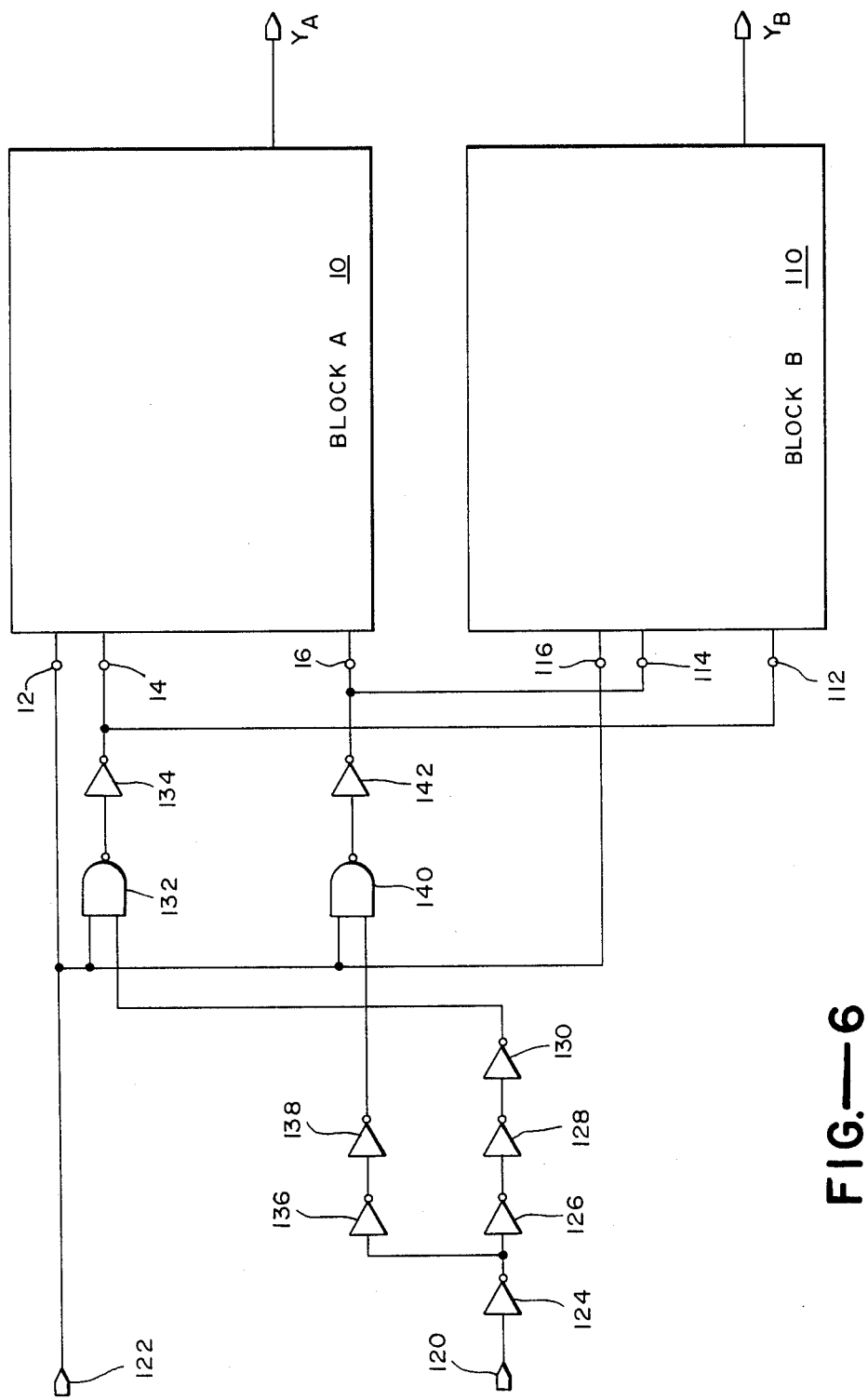
FIG.—6

DIFFERENTIAL LINE DRIVER WITH SHORT CIRCUIT PROTECTION

BACKGROUND OF THE INVENTION

1. Field of the Invention

This invention relates to differential line driver circuits and, more particularly, to a CMOS differential line driver circuit with improved short circuit protection.

2. Prior Art

Line driver circuits are used to drive transmission lines. If the output terminal of such a device is shorted to ground or is coupled through an excessively low impedance to ground, excessive current is drawn from the output terminal of the line driver. In order to prevent the output line driver from being damaged, it is necessary to detect a short-circuit fault condition and take action to prevent the line driver from being damaged. Various schemes are available in the prior art for such short-circuit detection and protection. These schemes may be classified into one of two categories. The first category is for short-circuit protection schemes which sense an excessive amount of output current such as occurs when a short-circuit fault is present. The other technique involves various voltage-sensing techniques to detect a short-circuit condition.

Current sensing techniques in the prior art utilize a resistor connected in series between the primary power control device and the load. The resistor value is generally low and a relatively small voltage is developed across that resistor by the load current to provide a voltage proportional to the load current. When the load current exceeds a predetermined value, protection and-/or disabling circuits are energized.

An example of a current detection scheme is shown in U.S. Pat. No. 3,944,889 which distinguishes between a true short circuit load condition and a condition in which short duration surges of high current are supplied to a load, which surges are caused, for example, by switch contact bounce or which results from the nature of the load, for example transient characteristics when the load is a tungsten filament lamp. When the current exceeds a predetermined level, the voltage detector provides an output signal which gates a clock signal into a binary counter. If the short-circuit condition persists, a predetermined number of clock pulses are counted to provide a binary word which is detected to trigger a latch. The latch is set to disable a switch supplying current to the load. The binary counter, in effect, serves as a delay function to verify that the short-circuit condition is a true short-circuit condition, rather than a transient condition.

Another example of a current detection scheme is shown in U.S. Pat. No. 4,322,690 which discloses a short-circuit protection scheme for an audio amplifier which utilizes a current-measuring resistor in series with each of a pair of push-pull output transistors. A feedback transistor is connected in parallel with one of the measuring resistors and is connected to the control electrode of a thyristor. The thyristor is triggered to disable a preamplifier when excessive current is drawn by the output transistor.

An example of a voltage-sensing protection circuit is disclosed in U.S. Pat. No. 4,291,357 in which an output voltage is sensed and the output device is shut off when the output voltage falls below a predetermined trip voltage. This protection circuit is disabled during circuit start-up or during rise time of a signal. This patent points out a problem which may exist with short circuit protection systems. This problem is the so-called false trip problem which may occur during start-up, that is when power is first applied to a circuit or during rise time, that is when the output voltage is required to switch from a low level to a high level. U.S. Pat. No. 4,291,357 avoids the false trip problem by providing a greater delay for an input signal to a transistor which disables the amplifier in comparison with the input delay for a signal in the signal path to the output amplifier. The difference in delay time is utilized to disable the protection circuitry until the output voltage has risen to a value above a predetermined trip voltage level. The signal delay for the scheme was obtained by using the recovery time needed for a transistor to recover from saturation. This technique depends on a parameter, namely, recovery of a transistor from saturation, which in practice may be difficult to control precisely.

Line driver circuits typically include a so-called pull-up transistor, which provides high output signal levels, and a so-called pull-down transistor, which provides low output signal levels. The current delivered by a pull-up transistor depends on the load impedance. For a very low impedance or for a short-circuit fault condition, a pull-up transistor begins to supply current as the output voltage goes from a low state toward a high state. If excessive current is drawn through a pull-up transistor, it may be damaged. Note that a pull-down transistor serves as a current sink for the output load and does not need short-circuit protection.

Differential line driver signals are frequently used to drive transmission lines and one is called a true signal and its complement is called a false signal. Differential line driver circuits provide two differential output signals, that is, signals which are equal in magnitude but of opposite phase. These signals are complementary. Differential line-driver circuits typically use two separate line driver circuits, one fed with a true input signal and the other fed with a false input signal. These circuits are required to have substantially the same propagation delay. Differences in propagation between the two signals is measured by a skew characteristic which measures the time difference for a signal transition at the output of a differential line driver. The time difference is measured between the 50% amplitude points of each of the signals. A good skew characteristic is less than one nanosecond.

For line driver circuits, conventional current-sensing short-circuit protection schemes typically have a current-sensing resistor in series with the pull-up transistor because a short-circuit condition causes excessive current to be drawn through the pull-up transistor, while the pull down transistor does not require a current-sensing resistor. Insertion of a resistance in series will increase the pull-up rise time, while the pull-down fall time is unaffected. A differential line driver system uses two line driver circuits, one providing a true output signal and the other providing a complementary false output signal. For a given signal transition, such as for example a low to high transition, the pull-up transistor of the one circuit is active and the pull-down circuit of the other circuit is active. The one circuit has a slower time constant than the other. Consequently, the skew characteristic is not optimum because the one circuit, with a series current-sensing resistor, reaches its 50% amplitude value slower than the other circuit, without a series resistor. Therefore, it should be appreciated that conventional current-sensing schemes for short-circuit protection adversely affect the operating characteristics of line driver circuits In particular, differential line driver systems, using line driver circuits operating in complementary modes, are adversely affected by use of series current-sensing resistors.

SUMMARY OF THE INVENTION

It is therefore an object of the invention to provide an improved current-sensing short-circuit protection technique for a line driver circuit which does not degrade the pull-up time for said circuit.

It is another object of this invention to provide a short-circuit protection technique for a differential line driver circuit which does not degrade the skew characteristic of the complementary output signals.

In accordance with these and other objects of the invention, a line driver circuit is provided with a short circuit protection scheme which does not degrade the rise time performance of the line driver. This is especially important in a differential line driver system where a first line driver circuit provides a true signal and a second identical line driver circuit provides a complementary false signal. To provide differential output signals of equal magnitude and opposite phase, while the true signal is rising the false signal is falling and vice-versa. Differences between rise time and fall time will produce skew between the true and the false output signals.

A line driver circuit according to the invention includes two pull-up transistors coupled between the positive voltage supply and the output terminal. One, called the primary pull-up transistor, provides a primary current to a load. The other, called a secondary pull-up transistor, provides a secondary current to the load. To protect the current against short-circuits at its output terminal, means are provided for disabling conduction of the primary pull-up transistor when the secondary current exceeds a predetermined level for a period greater than a predetermined time period. Typically, the predetermined time period is set to be greater than the usual transition time for a pull-up transistor connected to an output terminal going from a low to a high state. During that transition time, a transient current spike is produced. A short-circuit protection scheme must distinguish between that transient current and a true short-circuit fault current.

A fault signal, indicative of a short-circuit condition, is active when the secondary current exceeds the predetermined level for the predetermined time period. To prevent false triggering of the protection mechanism, the fault signal is delayed and compared to the fault signal. A cutoff signal is provided by the comparator when the fault signal and the delayed fault signal are active at the same time.

The cutoff signal drives a switch which couples the output terminal to a control input terminal of a logic gate. The logic gate inhibits drive signals to the primary pull-up transistor when the cutoff signal is active, which occurs when the output terminal is short-circuited.

According to another aspect of the invention, a first and a second pull-down transistors are connected between the output terminal and ground. A true input signal and a complementary false input signal drive, respectively, the pull-up transistor and the pull-down transistor.

Accordingly to a further aspect of the invention, a means for sensing the current through the secondary pull-up transistor is provided which includes, for example, a current-sensing resistor connected in series with the secondary pull-up transistor. The current through the resistor develops a sensing voltage which activates a pass gate transistor to produce the fault signal.

Still another aspect of the invention provides a differential line driver system using a pair of short-circuit protected line driver circuits arranged to provide complementary, differential output signals. Each of these line driver circuits is configured with the short-circuit protection capability of the invention. Since the short-circuit detection and protection circuitry does not significantly change the performance characteristics of each line driver circuit, the skew characteristic for a differential system using two complementary line driver circuits will not be significantly affected.

To drive each of the respective line driver circuits, means are provided for producing a true input signal and a complementary false input signal from a single input signal. To ensure accurate phasing between the true signal and the complementary false signal, appropriate signal delays are introduced in each signal path prior to the line driver circuits. A system enable signal gates the true and false input signals to the respective line driver circuits. When the system enable signal is inactive, each output terminal is in a high impedance state.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 shows a line driver circuit having short circuit protection according to the invention.

FIG. 2 shows the input/output voltage characteristics for CMOS devices having a P-channel to N-channel ratio of 1:4 and of 2:1.

FIG. 3 shows signal waveforms at various terminals within the line driver circuit of FIG. 1 for a condition where the output terminal is not short-circuited.

FIG. 4 shows signal waveforms at various terminals within the line driver circuit of FIG. 1 according to the invention when the output terminal is short-circuited.

FIG. 5 shows a complementary line driver circuit for a differential line driver system according to the invention.

FIG. 6 shows a schematic representation of a complete differential line driver system according to the invention.

DETAILED DESCRIPTION OF THE PREFERRED EMBODIMENTS

Reference will now be made in detail to the preferred embodiment of the invention, an example of which is illustrated in the accompanying drawings. While the invention will be described in conjunction with the preferred embodiment it will be understood that it is not intended to limit the invention to that embodiment. On the contrary, the invention is intended to cover alternatives, modifications and equivalents, which may be included within the spirit and scope of the invention as defined by the appended claims.

FIG. 1 shows a schematic diagram of a line driver circuit 10 according to the invention. An enable signal $E_N$ is provided at an enable input signal terminal 12. This signal, when it is in the high state, enables the circuit to provide an output signal $Y_A$. Note that, as explained hereinbelow in connection with FIG. 6, when the enable signal $E_N$ is at a low state, the output terminal for signal $Y_A$ is at a high-impedance state, or tri-state mode. Operation of the enable signal is described more completely hereinbelow. A true input signal T is provided at an input terminal 14 of the circuit and a complementary input false signal F is provided at an input terminal 16 of the circuit. Both of these signals are complementary to each other, that is, they are equal in magnitude but opposite in phase. The true input signal T is coupled to one input of a NAND1 gate 18. As long as the signal on the other input to the NAND1 gate 18 is at a high state, then the true signal T is gated to pass through the NAND1 gate 18 to an inverter 20. The gated output signal of the inverter 20 is connected to a terminal T4. The true signal T also is transmitted through two more inverters 22,24 and is provided as an ungated signal at a terminal T3 as shown. The gated true signal T and the true signal T are to arrive at respective terminals T4 and T3 at substantially the same time because the propagation delays through NAND1 gate 18 and inverter 20 are set equal to the propagation delays through inverters 22, 24.

Similarly, the false input signal F at input terminal 16 is passed through a pair of inverters 26,28 to a terminal T5. An output signal from inverter 26 is coupled to an input of inverter 30 which has its output connected to a terminal T6. Because the inverters 26,28 and 26,30 have the same propagation delays, the false signal F is simultaneously present at terminals T5 and T6. Note that the gated and ungated true signal T and the false signal F are complements of each other so that when the true signal T is at the high state, the false signal F is at a low state and, when the true signal T is at a low state, the false signal F is at a high state.

The purpose for having true signals T connected to terminals T3 and T4 is to have the gated and ungated true signals drive the respective gates of NMOS pull-up transistors Q3 and Q4 to control their conduction. Both of these transistors have their drains connected to a VDD supply voltage, typically a +5 volt source. Similarly the false signal F is coupled to the gate terminals of a pair of NMOS pull-down transistors Q5, Q6, which have their drains connected to the output terminal 32 of the circuit and their sources to a ground potential. The source of the primary pull-up transistor Q4 is directly connected to the output terminal 32. The source of the secondary pull up transistor Q3 is connected to a source-terminal node 34. A current sensing resistor R1 is connected in series between the node 34 and the output terminal 32. The current sensing resistor R1 is an N-type diffusion resistor with a relatively large resistance value in comparison to the value of a typical current-sensing resistor where the typical prior art resistor must be kept low in value to avoid a large voltage drop across the sensing resistor The current flowing through the primary pull-up Q4 is designed to be six times greater than the current flowing through the secondary pull-up transistor Q3 so that the voltage drop across the sensing resistor R1 does not significantly affect the output signal because the rise time of the primary pull-up transistor is slowed by a series resistance. Current at the output terminal 32 flows primarily through the pull-up transistor Q4 when the output signal $Y_A$ is initially at a low level and begins to rise, or pull-up, to a high level. In that case transistor Q3 is turned on and provides current through the current sensing resistor R1 to the output terminal 32. Transistors Q5 and Q6 are pull-down transistors respectively for Q3 and Q4. The true signal T and its complement false signal F are present at the same time to control the operation of transistors Q3, Q4, Q5, and Q6. Note, however, that the operation of Q4 is also controlled by the operation of the NAND1 gate 18. Operation of this gate determines whether transistor Q4 is activated by the true signal T to provide the primary output current to the output terminal 32 of the circuit. Transistors Q4 and Q3 are designed such that the current passing through transistor Q4 is approximately six times greater than the current passing through transistor Q3. Inhibiting gating the true signal to Q4 permits the pull-up transistor Q4 to be cut-off while still permitting transistor Q3 to provide a short-circuit current of approximately 50 milliamperes when the output terminal 32 is short circuited to the ground potential.

When the enable signal $E_N$ present at terminal 12 is high, a pass transistor Q7 is turned on and couples the voltage at terminal 34 on the source of the secondary pull-up transistor Q3 to a terminal 40. A shunt transistor Q8 which has its drain connected to the terminal 40 and its source is connected to the ground potential. The enable signal $E_N$ at the input terminal 12 of the circuit is also coupled to the input terminal of an inverter 42 and its output is connected to the gate of the shunt transistor Q8. Transistor Q8 is turned on when the enable signal is inactive, or low, so that Q8 pulls the terminal 40 to near the ground potential. Terminal 40 is connected to the gate of a pass-gate transistor Q9, which has its source connected to the output terminal 32 of this circuit. The pass-gate transistor Q9 responds to the voltage developed across the current sensing resistor R1. When this voltage exceeds a predetermined value, the pass-gate transistor Q9 is turned on. The drain of the pass-gate transistor Q9 is connected to a terminal B which is, in turn, connected to the positive voltage supply through a load device, for example, a diode-connected transistor Q2. When transistor Q9 turns on the voltage at terminal B drops to a low level.

Terminal B has a first delay circuit, CELL 1 designated by reference number 50, connected to it. Terminal B also has a second delay circuit, CELL 2 designated by reference number 52 connected to it. CELL 1 includes a pair of inverters 54,56 connected in a series. Similarly, the second delay unit CELL 2 has four inverters 58, 60, 62, 64 connected in series with terminals B.

All of the inverters are formed as complementary MOS, that is CMOS, inverter circuits. In FIG. 2 the dotted line 70 shows the voltage transfer characteristic for a CMOS inverter for the case where the transition voltage is designed by proper selection of circuit parameters to be approximately midway between the 5 volt supply voltage and ground. In the case of inverter 54, the transistors of the device are designed to provide a transition at approximately 1.25 volts. This is accomplished by adjusting the channel with the N device to be four times greater than the channel width of the P device. This transfer characteristic permits the inverter 54 to turn on at a low voltage input level and to react quickly to a rising voltage level. This feature will be discussed in connection with operation of CELL 1 as discussed hereinbelow. FIG. 2 also shows the voltage transfer characteristic for inverters used for the second inverter 56 and for each of the inverter stages of the second delay circuit 52. This transfer characteristic 72 has a transition which occurs at an input voltage level of approximately 2.5 volts.

Note that the propagation delay of CELL 2 is designed to be substantially greater than the propagation delay of CELL 1.

If the output voltages of the first delay unit 50 and a second delay unit 52 are both simultaneously low, the output level of a NOR1 gate 80 goes to a high level. This causes a switch transistor Q10 to be turned on which causes a connection to be made between the circuit output terminal 32 and the terminal A. Transistor Q1 is a diode connected transistor connected between the terminal A and the power supply voltage which holds terminal A normally high. A low voltage at terminal A, which is coupled to an input terminal of a NAND1 gate 18, disables the NAND1 gate and inhibits the true signal T from passing therethrough. A low level is placed on the gate of the primary pull-up transistor Q4 which turns off.

The input terminal of the NOR1 gate 80 to which is coupled the output of the first delay circuit 50 is labeled L. The other input of the NOR1 gate 80 to which is coupled the output of the second delay circuit 52 is labeled M. The output terminal of the NOR1 gate 80 which is coupled to the gate of the pass transistor Q10 is labeled N.

OPERATION OF THE CIRCUIT IN ITS NORMAL MODE

FIG. 3 shows waveform for signals at various terminals when the circuit 10 is operating in the normal mode of operation, that is, when the output terminal 32 is not short-circuited.

The waveform labeled I represents the voltage input waveform for an input signal I (described hereinbelow in connection with FIG. 6) from which are derived, with equal propagation delays, the true input signal T and the false input signal F. The low-to-high transition designated by reference number 90 is significant because if the output terminal 32 happened to be short-circuited, this signal would ordinarily cause the circuit to set the output voltage level for signal $Y_A$ to a high level and thereby force current into a short circuit. The case where the input signal I goes from a high to low state is not of concern because in the low state no current is drawn from the circuit and the circuit cannot be damaged. Therefore attention will focus on the low-to-high transition for the input signal I. When this transition occurs as indicated by reference numeral 90 and, after some propagation delay, at time 92 the output currents $I_{YA}$ begins to increase. Since some of the current is provided by the secondary pull-up transistor Q3, the voltage $V_R$ across the current sensing resistor R1 also begins to rise at time 92. As the voltage $V_R$ begins to rise, the voltage at terminal B falls slightly. The voltage at terminal B never falls below the threshold, or transition, voltages of the first inverter stage of the first delay circuit 50. The output voltage at terminal L therefore does not drop. The inverters of the second delay unit 52 are much slower, but they do not charge state because the signal at terminal B does not fall begins to fall off so that the voltage $V_R$ across the current sensing resistor R1 also begins to fall off.

OPERATION OF THE CIRCUIT WITH ITS OUTPUT SHORT-CIRCUITED

FIG. 4 shows the waveforms of signals at various terminals when the output terminal 32 has a short-circuit or excessive current drain condition present In this case the output terminal 32 is assumed short-circuited to ground. The input signal I is positive at time 100 and after a delay the secondary pull-up transistor Q3 is turned on and begins to deliver current through resistor R1 to the output terminal 32. The current provided by the secondary pull-up transistor Q3 passes through the current sensing resistor R1 and provides a voltage $V_R$ which turns on the pass-gate transistor Q9 causing the voltage at terminal B to drop from a high level to a low level and remain at the low level for the duration of the high level portion of the input signal I. The low level at terminal B after a slight delay td1 causes the terminal L at the output of the first delay unit 50 to drop to a low level. After the propagation delay time td2 provided by the second delay circuit 52 elapses, the voltage level at terminal M drops to a low level. Both terminals L and M being at low levels cause the voltage at terminal N to go to a high level. This in turn turns on Q10 and causes output terminal 32 to be connected to terminal A. The output signal $Y_A$ at terminal 32 is at a short-circuited, or low, level which causes a low level to be present at terminal T4 on the gate of the primary pull-up transistor Q4. Therefore transistor Q4 cannot turn on. The short-circuit current IYA through Q3 causes $V_R$ to clamp the pass-gate transistor Q9 in the on state which holds Q4 off for the duration of I remaining in a high state.

CELL 1 has a finite propagation delay which can be used to advantage. If a short-circuit fault occurs on the output terminal, signal Y is at a low level which is fed through to terminal A for disabling the primary pull-up transistor Q4. If no short-circuit occurs, signal Y goes from a low to high state.

A DIFFERENTIAL LINE DRIVER SYSTEM

FIG. 5 shows a second line driver circuit 110. This circuit is the same in structure to the line driver circuit 10 as described hereinabove. In operation, the difference between these circuits is that the second line driver circuit 110 operates with a true input signal T at an input terminal 112 and a false input signal F at an input terminal 114. These signal connections reversed from those signals as shown in connection with the first line driver circuit 110 to provide a complementing output signal at $Y_B$.

FIG. 6 shows a complete differential line driver circuit having a first line driver circuit, designated Block A, which is the same configuration as the line driver circuit 10 as shown in FIG. 1. The other line driver circuit, designated as Block B, is the same configuration as the line driver circuit 110 as shown in FIG. 5.

An input signal I to this differential line driver circuit is coupled to an input terminal 120 and an enable signal $E_N$ is provided at an input terminal 122 which is coupled to the input terminals 12 and 116, respectively, of Block A and Block B. The input signal I is inverted in a first input signal inverter 124. The output signal of that inverter is then three times inverted through a series of three inverters 126, 128, 130 and then fed to one input of a NAND gate 132. The other input of the NAND gate 132 is the enable signal $E_N$ which serves to gate the input signal I to the input of another inverter 134, the output connection with FIG. 1.

The output signal of the inverter 124 is also passed through inverters 136, 138 to one input terminal of another NAND gate 140, which is also activated by the enable signal $E_N$. The output signal of the other NAND gate 140 is inverted by inverter 142, the output of which is the false signal F. The delay through the inverters 126, 128, 130 and the delay through the inverters 136, 138 are matched such that the true signal T and the false signal F are complementary.

Both Block A and Block B for the differential line driver system as shown in FIG. 6, have the protection circuitry according to the invention. With this circuit design the complementary output signals $Y_A$ and $Y_B$ of this differential line driver system have a skew characteristic of less than 1.5 nanoseconds, where skew has been defined as the time difference between the respective signals passing through their 50% amplitude points. This skew characteristic is possible even though current-sensing was used to trigger a short-circuit protection circuit because the current sensed was not the pull-up current of the primary pull-up transistor but, rather, the pull-up current of the secondary pull-up transistor. It should be appreciated that the invention provides a protection scheme which does not interfere with the normal operation of the circuit. For example, the current-sensing resistor does not cause a difference between the rise time and fall time of a line driver stage. Since Block A and Block B are operating in complementary modes, the rise time of Block A coincides with the fall time of Block B and vice-versa. Therefore, any difference between rise time and fall time would produce significant degradation in the skew characteristic for the complementary, differential output signals $Y_A$ and $Y_B$.

The foregoing description of a specific embodiment of the present invention has been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A line driver circuit having short-circuit protection comprising:

primary pull-up transistor means connected between a first voltage reference level and an output terminal for providing a primary current to said output terminal;

a secondary pull-up transistor means coupled between said first voltage reference level and said output terminal for providing a secondary current to said output terminal; and means for disabling conduction of said primary current through said primary pull-up transistor means in response to said secondary current through said secondary pull-up transistor means exceeding a predetermined level for a period greater than a predetermined time period, wherein the means for disabling conduction of said primary current through said primary pull-up transistor means includes means for providing a fault signal which is active when said secondary current in said secondary pull-up transistor means exceeds said predetermined level; wherein the means for disabling conduction includes logic gate and means for inhibiting input drive signals to said primary pull-up transistor means;

means for determining that said fault signal is active for greater than said predetermined time period, said determining means providing a cutoff signal which is active to disable conduction of said primary current through said primary pull-up transistor means, wherein the means for determining that said fault signal is active includes means for delaying said fault signal for a time greater than said predetermined time period to provide a delayed fault signal and includes means for comparing said fault signal and said delayed fault signal to provide said cutoff signal to disable conduction of said primary current when said fault signal and said delayed fault signal are active at the same time.

2. The line driver circuit of claim 1 wherein said logic gate means inhibits input drive signals when said cutoff signal is active.

3. The line driver circuit of claim 2 including switching means for coupling said output terminal to said logic gate means when said cutoff signal is active.

4. The line driver circuit of claim 1 including a pull-down transistor connects between said output terminal and a second voltage reference level and wherein conduction of said primary pull-up transistor and of said secondary pull-up transistor are controlled by a true input signal to said line driver circuit and said pull-down transistor is controlled by a false input signal to said line driver current, the false input signal is the complement of said true data signal.

5. The line driver circuit of claim 4 including a second pull-down transistor which is connected between said output terminal and said second voltage reference level and which is controlled by said false data signal.

6. The line driver circuit of claim 1 including current-sensing means for measuring said secondary current through said secondary pull-up transistor.

7. The line driver circuit of claim 6 wherein said current-sensing means includes a current-sensing resistor connected in series with said secondary pull-up transistor means.

8. The line driver circuit of claim 7 wherein said secondary current through said current-sensing resistor produces a sensing voltage across said resistor and wherein the means for providing said fault signal includes a pass-gate transistor activated by said sensing voltage to produce said fault signal.

9. The line driver circuit of claim 8 including transistor means controlled by an ENABLE signal in its active state for coupling said sensing voltage to said pass-gate transistor.

10. The line driver circuit of claim 9 including second transistor means controlled by said ENABLE signal in its inactive state to inactivate said pass-gate transistor to a high impedance state.

11. The line driver circuit of claim 1 wherein said primary current is greater than said secondary current.

12. A line driver circuit having short-circuit protection, comprising:

a primary pull-up transistor having a gate terminal, having a drain connected to a first voltage potential source, and having a source connected to a circuit output terminal of said line-driver circuit to provide a primary pull-up current to said circuit output terminal;

a primary pull-down transistor having a gate terminal, having a drain connected to said circuit output terminal, and having a source connected to a second voltage potential source;

a current-sensing resistor having one terminal connected to said current output terminal;

a secondary pull-up transistor having a gate terminal, having a drain connected to said first voltage potential source, and having a source connected to the other terminal of said current-sensing resistor to provide a secondary pull-up current to said circuit output terminal wherein current through said current-sensing resistor produces a sensing voltage across said current sensing resistor;

a secondary pull-down transistor having a gate terminal, having a drain connected to said circuit output terminal, and having a source connected to said second voltage potential source;

a true signal input terminal coupled to the gate terminals of said primary and said secondary pull-up transistors;

a false signal input terminal coupled to the gate terminals of said primary and said secondary pull-down transistors, wherein said true signal input terminal and said false signal terminals, respectively, receive a true signal and its complementary false signal for controlling said pull-up and said pull-down transistors;

a logic gate connected between said true signal input terminal and the gate terminal of said primary pull-up transistor to disable said primary pull-up transistor;

a pass-gate transistor having its gate terminal coupled to said source terminal of said secondary pull-up transistor and having its source terminal connected to the circuit output terminal such that its gate-to-source voltage is determined by said sensing voltage developed across said current-sensing resistor and wherein said pass-gate transistor turns on when said sensing voltage exceeds a predetermined value, said predetermined value indicative of a short-circuit fault condition at said circuit output terminal;

a load device connected between said first voltage potential and the drain of said pass-gate transistor;

a fault detection circuit including a first short-time-delay cell and a second long-time-delay cell, each having an input terminal coupled to the drain of said pass-gate transistor and each having an output terminal connected to respective input terminals of a comparator, wherein the long-time-delay cell has a time delay greater than a predetermined time period such that, if a short-circuit fault is present at the circuit output terminal, the output signal of the short-time-delay cell and the output signal of the long-time-delay cell are both detected by said comparator to be active at the same time to generate a switch-enable output signal from the output terminal of said comparator; and a switch transistor having its gate connected to the output terminal of said comparator, said switch transistor being turned on by said switch-enable output signal to connect the circuit output terminal to an input terminal of said logic gate to disable said primary pull-up transistor when a short-circuit fault occurs on the circuit output terminal exceeding the time delay of the long-time-delay cell.

13. A short-circuit protected differential line driver system providing a first output signal at a first output terminal and a second complementary false output signal at a second output terminal, comprising:

(1) a first line driver circuit, providing said first time output signal wherein said first line driver circuit comprises:

a first primary pull-up transistor means connected between a first voltage reference level and said first output terminal for providing a first primary current to said first output terminal;

a first secondary pull-up transistor means coupled between said first voltage reference level and said first output terminal for providing a first secondary current to said output terminal; and first means for disabling conduction of said first primary current through said first primary pull-up transistor means in response to said first secondary current through said first secondary pull-up transistor means exceeding a first predetermined level for a period greater than a first predetermined time period;

(2) a second line driver circuit providing said second complementary false output signal, wherein said second line driver circuit comprises:

a second primary pull-up transistor means connected between said first voltage reference level and said second output terminal for providing a primary current to said output terminal;

a second secondary pull-up transistor means coupled between said first voltage reference level and said second output terminal for providing a second secondary current to said output terminal; and second means for disabling conduction of said second primary current through said second primary pull-up transistor means in response to said second secondary current through said second secondary pull-up transistor means exceeding a second predetermined level for a period greater than a second predetermined time period; and (3) means for providing true input signals to said first and said second line drivers and for providing false input signals to said first and said second line drivers, where said true input signals and said false input signals are complementary signals derived from or input signal to said differential line driver circuit.

14. The system of claim 13 wherein the means for providing said true input signal and for providing said false input signal comprises:

a first means for producing said true signal in phase with said input signal;

a second means for producing said false signal inverted in phase from said input signal;

wherein the respective signal delays in said first and said second means for producing said time and said false signals are substantially equal.

15. The system of claim 14 including means for disabling said true and said false signals as input signals to said first and said second line driver circuits.

16. The system of claim 15 wherein said first line driver circuit includes a first pull-down transistor controlled by said true signal and connected between said first output terminal and a second voltage reference level;

wherein said second line driver circuit includes a second pull-down transistor controlled by said false signal and connected between said second terminal and said second voltage reference level.

17. The system of claim 15 wherein means for disabling both of said primary pull-up transistor means, both of said secondary pull-up transistor means, and both of said pull-down transistors to place said output terminals in a high impedance state.

18. The system of claim 13 wherein said first and said second means for disabling conduction respectively of said first and said second primary pull-up currents includes respective means for determining that a short-circuit output fault condition exceeding a predetermined time is present to disable conduction of said respective primary pull-up currents.

19. The system of claim 18 wherein each line driver circuit includes:
respective means for generating a fault signal which is active when said respective secondary pull-up current exceeds a predetermined level for a predetermined period of time;
respective means for delaying said fault signal for a time greater than said predetermined time period; and
respective means for comparing said fault signal and said delayed fault signal to disable said respective primary pull-up current when said fault signal and said delayed fault signal are active at the same time.

20. The system of claim 13 wherein said respective means for disabling conduction of primary pull-up current includes a current-sensing resistor in series with said respective secondary pull-up transistor means.

* * * * *